US005759741A

United States Patent [19]

Pearce et al.

[11] Patent Number: 5,759,741

[45] Date of Patent: Jun. 2, 1998

[54] BARRIER LAYER FOR LASER ABLATIVE IMAGING

[75] Inventors: Glenn T. Pearce, Fairport; Stephen M. Neumann, Rochester, both of N.Y.

[73] Assignee: Eastman Kodak Company, Rochester, N.Y.

[21] Appl. No.: 797,221

[22] Filed: Feb. 11, 1997

[51] Int. Cl.$^6$ .................. B41M 5/26; G03F 7/36

[52] U.S. Cl. .................. 430/271.1; 430/269; 430/945; 430/201; 430/200; 503/227

[58] Field of Search .................. 430/200, 201, 430/945, 269, 270.1, 273.1, 271.1; 503/227

[56] References Cited

U.S. PATENT DOCUMENTS

| | | | |
|---|---|---|---|
| 4,772,582 | 9/1988 | DeBoer | 430/201 |
| 4,973,572 | 11/1990 | DeBoer | 430/201 |
| 5,342,821 | 8/1994 | Pearce | 503/227 |
| 5,459,017 | 10/1995 | Topel, Jr. et al. | 430/269 |
| 5,468,591 | 11/1995 | Pearce et al. | 430/201 |
| 5,518,861 | 5/1996 | Coveleskie et al. | 430/200 |
| 5,576,144 | 11/1996 | Pearce et al. | 430/200 |
| 5,631,117 | 5/1997 | Nakajima et al. | 430/200 |

FOREIGN PATENT DOCUMENTS 60-240495 11/1985 Japan .

*Primary Examiner*—Martin Angebranndt
*Attorney, Agent, or Firm*—Harold E. Cole

[57] ABSTRACT

An ablative recording element comprising a support having thereon, in order, a barrier layer and a colorant layer comprising a colorant dispersed in a polymeric binder, the colorant layer having an infrared-absorbing material associated therewith, and wherein the barrier layer contains polymeric beads.

16 Claims, No Drawings

BARRIER LAYER FOR LASER ABLATIVE IMAGING

This invention relates to the use of a barrier layer in a laser ablative recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off substantially all of the image dye and binder at the spot where the laser beam hits the element. In ablative imaging, the laser radiation causes rapid local changes in the imaging layer thereby causing the material to be ejected from the layer. Ablation imaging is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission Dmin density value serves as a measure of the completeness of image dye removal by the laser.

U.S. Pat. No. 5,468,591 relates to a laser dye removal element with a polymeric barrier layer between support and imaging layer. However, there is no disclosure of the use of any particles in this barrier layer.

U.S. patent application Ser. No. 08/295,315 relates to a laser dye removal element wherein particles are contained in an overcoat or surface layer to improve scratch resistance. There is a problem with this element, however, in that the particles may be lost under very mild stresses.

It is an object of this invention to provide an ablative recording element wherein particles are employed which are not easily removed. It is another object of this invention to provide a single-sheet process which does not require a separate receiving element.

These and other objects are achieved in accordance with the invention which comprises an ablative recording element comprising a support having thereon, in order, a barrier layer and a colorant layer comprising a colorant dispersed in a polymeric binder, the colorant layer having an infrared-absorbing material associated therewith, and wherein the barrier layer contains polymeric beads. In a preferred embodiment, the polymeric beads have a mean diameter from about 2 μm to about 4 μm.

The polymeric beads useful in the invention include the following:

| | | Diameter (μm) |
|---|---|---|
| P1 | 56/44 (wt/wt) Styrene/divinylbenzene copolymer | 5 |
| P2 | Polytetrafluoroethylene [MP-1300 from DuPont] | 8–15 (mean) |
| P3 | Micronized polyethylene, polypropylene, and oxidized polyethylene wax [S363 from Shamrock Technologies, Inc.] | 5 (mean) |
| P4 | 95/5 (wt/wt) Styrene/divinylbenzene copolymer | 4 |
| P5 | Polydivinylbenzene | 4 |
| P6 | Polytetrafluoroethylene [MP-1000 from DuPont] | 8–15 (mean) |
| P7 | Polyethylene wax [Neptune ® IN1 from Shamrock Technologies, Inc.] | 5 (mean) |
| P8 | Polytetrafluoroethylene (HydroCERF ® 9174 from Shamrock Technologies, Inc.] | <10 |
| P9 | Micronized polyethylene [Microdispersion 250 from Micro Powders, Inc.] | 9 (mean) |
| P10 | Micronized polytetrafluoroethylene [Microdispersion 411 from Micro Powders, Inc.] | 7 (mean) |
| P11 | Silicon Resin [Tosperol ® 145 from Toshiba Silicon Co., Ltd.] | 4.5 |
| P12 | Polyethylene and polytetrafluoroethylene mixture [Polyfluo ® 200 from Micro Powders, Inc.] | 3 |
| P13 | 80/20 Styrene/divinylbenzene copolymer | 2 |

The polymeric beads useful in the invention may be employed in any amount useful for the intended purpose. In general, good results have been obtained at a coverage of from about 0.05 $g/m^2$ to about 1.0 $g/m^2$.

Any barrier layer may be employed in the invention provided it is useful for the intended purpose. In general, good results have been obtained when the barrier layer comprises a vinyl polymer having recurring units of the following formula:

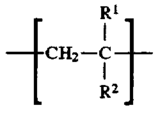

wherein:

$R^1$ and $R^2$ each independently represents a halogen atom; a haloalkyl group with at least one halogen atom in its beta-position of the carbon to which $R^1$ or $R^2$ is attached; a ketal group; an acetal group; a thioketal group; a thioacetal group; a substituted or unsubstituted alkyl group; or a group containing a double or triple bond between any two atoms, one of which is adjacent to the carbon to which $R^1$ or $R^2$ is attached, such as cyano, carbonyl, isocyanate, azide, sulfonyl, nitro, phosphoric, phosphonyl, acetylenic, ethylenic, substituted or unsubstituted aryl or heteroaryl;

with the proviso that at least one of $R^1$ and $R^2$ represents a group containing a double or triple bond between any two atoms, one of which is adjacent to the carbon to which $R^1$ or $R^2$ is attached; or $R^1$ and $R^2$ may be joined together to form a ring, such as itaconic anhydride.

In a preferred embodiment of the invention, $R^1$ and $R^2$ each independently represents—$C(=X)R^3$, where X is O, S, NR, or $N(R)_2^+$; $R^3$ is R, OR, $O^-M^+$, OCOOR, SR, NHCOR, $NHCON(R)_2$, $N(R)_2$, $N(R)_3^+$, or $(N)_3$; $M^+$ is an alkali or ammonium moiety; and R is hydrogen, halogen, or a substituted or unsubstituted alkyl or cycloalkyl group; or X and $R^3$ may be joined together to form a ring.

In a preferred embodiment of the invention, the vinyl polymer has repeating units derived from alkyl 2-cyanoacrylates or amides, or methylene diacrylates or diamides. In another preferred embodiment, the vinyl polymer is a poly(alkyl cyanoacrylate) such as methyl-, ethyl-, propyl-, butyl-, 2-ethylhexyl-, or propoxy 2-cyanoacrylate.

The molecular weights of the vinyl polymers described above may be between 1,000 and 1,000,000 weight average molecular weight. Particularly good results have been obtained with polymers having a molecular weight between 2,000 and 500,000 weight average (polystyrene equivalent by size exclusion chromatography).

The vinyl polymers described above may also be copolymerized with other monomers. For example, the vinyl polymer may comprise copolymers of at least 50 wt. %, preferably more than 75 wt. %, of repeating units as described above along with other vinyl monomers such as acrylates and methacrylates, acrylamides and methacrylamides, vinyl ethers, vinyl alkyl esters, maleic anhydrides, maleimides, itaconic acid and esters, fumaric acid and esters, etc.

Examples of vinyl polymers useful in the invention include the following:

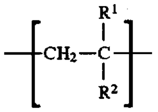

| Compound | $R^1$ | $R^2$ |
|---|---|---|
| 1 | $-C\equiv N$ | $-COOCH_3$ |
| 2 | $-C\equiv N$ | $-COOC_2H_5$ |
| 3 | $-C\equiv N$ | $-COOC_3H_7$ |
| 4 | $-C\equiv N$ | $-COOC_4H_9$ |
| 5 | $-C\equiv N$ | $-COOH$ |
| 6 | $-C\equiv N$ | $-C\equiv N$ |
| 7 | $-C\equiv N$ | $-COOCH_2CH(CH_2CH_3)C_4H_9$ |
| 8 | $-C\equiv N$ | $-COOCH_2CH_2OCH_2$ |
| 9 | $-C\equiv N$ | $-Cl$ |
| 10 | $-C\equiv N$ | $-CONHCH_3$ |
| 11 | $-C\equiv N$ | $-CON(CH_3)_2$ |
| 12 | $-COOCH_3$ | $-COOCH_3$ |
| 13 | $-CONHCH_3$ | $-CONHCH_3$ |
| 14 | $-C\equiv N$ | Copolymer 70% ($-COOCH_3$) 30% ($-COOC_2H_5$) |
| 15 | $-Cl$ | $-COOCH_3$ |

Another embodiment of the invention relates to a process of forming a single color, ablation image having an improved Dmin comprising imagewise heating by means of a laser, an ablative recording element comprising a support having thereon, in order, a barrier layer and a colorant layer comprising a colorant dispersed in a polymeric binder, the colorant layer having an infrared-absorbing material associated therewith, the laser exposure taking place through the colorant side of the element, and removing the ablated material, such as by means of an air stream, to obtain an image in the ablative recording element, and wherein the barrier layer contains the polymeric beads as described above.

It has been found that use of a vinyl polymer barrier layer in the above ablative recording element for laser ablative imaging significantly affects the desired cleanout as evidenced by the resulting faster writing speeds to achieve a given minimum density. Minimum densities of less than 0.10 are achieved in accordance with the invention.

The vinyl polymer barrier layer employed in this invention is useful with imaging layers which contain any type of colorant such as visible or infrared dyes, ultraviolet dyes, pigments, etc.

The vinyl polymer barrier layer employed in this invention may also include materials that absorb laser light, such as carbon black or infrared-absorbing dyes, such as those dyes described in U.S. Pat. No. 5,387,496, the disclosure of which is hereby incorporated by reference. Further Dmin reductions are observed when infrared-absorbing materials are present. The infrared-absorbing materials can be present in the barrier layer at between 2 and 75 wt-%, relative to the vinyl polymer, and preferably between 10 and 50 wt-%.

While any coverage of barrier layer may be employed which is effective for the intended purpose, good results have been obtained at coverages of from about 0.05 to about 1.0 $g/m^2$, preferably 0.1 to about 0.5 $g/m^2$.

The ablation elements of this invention can be used to obtain medical images, reprographic masks, printing masks, etc. The image obtained can be a positive or a negative image.

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials; the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

The reduction in Dmin obtained with this invention is important for graphic arts applications where the Dmin/Dmax of the mask controls the exposure latitude, for subsequent use. This also improves the neutrality of the Dmin for medical imaging applications. The dye removal process can be applied to either continuous (photographic-like) or halftone imaging methods.

The lower Dmin values achieved in accordance with the invention greatly expand the UV contrast of these ablative film elements, which enhances their usefulness when exposing UV-sensitive printing plates with UV radiation.

Any polymeric material may be used as the binder in the recording element employed in the process of the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); poly(vinyl halides) such as poly(vinyl chloride) and poly(vinyl chloride) copolymers; poly(vinyl ethers); maleic anhydride copolymers; polystyrene; poly(styrene-co-acrylonitrile); a polysulfone; a poly(phenylene oxide); a poly(ethylene oxide); a poly(vinyl alcohol-co-acetal) such as poly(vinyl acetal), poly(vinyl alcohol-co-butyral) or poly (vinyl benzal); or mixtures or copolymers thereof. The binder may be used at a coverage of from about 0.1 to about 5 $g/m^2$.

In a preferred embodiment, the polymeric binder used in the recording element employed in process of the invention has a polystyrene equivalent molecular weight of at least 100,000 as measured by size exclusion chromatography, as described in U.S. Pat. No. 5,330,876.

To obtain a laser-induced, ablative image using the process of the invention, a diode laser is preferably employed since it offers substantial advantages in terms of its small size, low cost, stability, reliability, ruggedness, and ease of modulation. In practice, before any laser can be used to heat an ablative recording element, the element must contain an infrared-absorbing material, such as pigments like carbon black, or cyanine infrared-absorbing dyes as described in U.S. Pat. No. 4,973,572, or other materials as described in the following U.S. Pat. No. 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the colorant layer and converted to heat by a molecular process known as internal conversion. Thus, the construction of a useful colorant layer will depend not only on the hue, transferability and intensity of the colorant, but also on the ability of the colorant layer to absorb the radiation and convert it to heat. The infrared-absorbing material or dye may be contained in the colorant layer itself or in a separate layer associated therewith, i.e., above or below the colorant layer. As noted above, the laser exposure in the process of the invention takes place through the colorant side of the ablative recording element, which enables this process to be a single-sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

Any dye can be used in the ablative recording element employed in the invention provided it can be ablated by the action of the laser. Especially good results have been obtained with dyes such as disclosed in U.S. Pat. No. 4,541,830; 4,698,651; 4,695,287; 4,701,439; 4,757,046; 4,743,582; 4,769,360; and 4,753,922, the disclosures of which are hereby incorporated by reference. The above dyes may be employed singly or in combination. The dyes may be used at a coverage of from about 0.05 to about 1 $g/m^2$ and are preferably hydrophobic.

Pigments which may be used in the colorant layer of the ablative recording layer of the invention include carbon black, graphite, metal phthalocyanines, etc. When a pigment is used in the colorant layer, it may also function as the infrared-absorbing material, so that a separate infrared-absorbing material does not have to be used.

The colorant layer of the ablative recording element employed in the invention may be coated on the support or printed thereon by a printing technique such as a gravure process.

Any material can be used as the support for the ablative recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly (tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 mm. In a preferred embodiment, the support is transparent.

The following examples are provided to illustrate the invention.

EXAMPLE 1

The following materials were employed in this example:

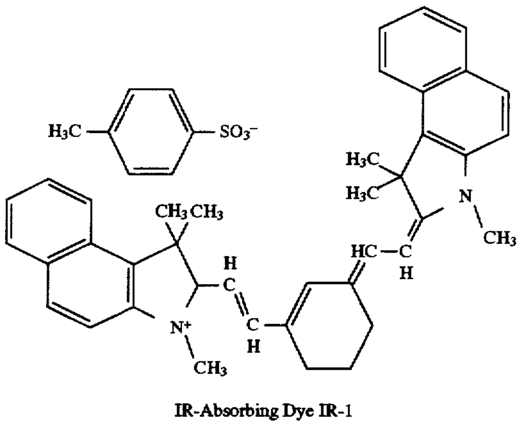

IR-Absorbing Dye IR-1

-continued

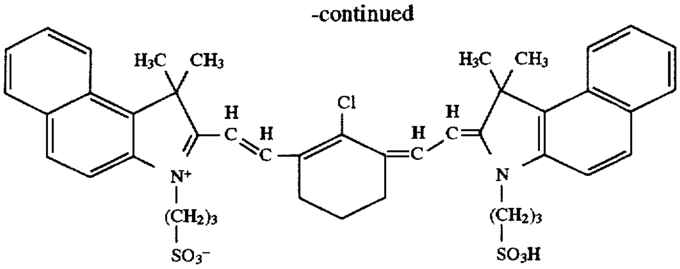

IR-Absorbing Dye IR-2

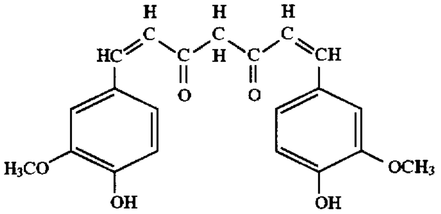

Yellow Dye Y-1

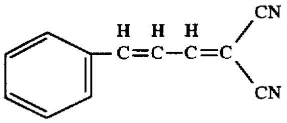

UV-Absorbing Dye UV-1

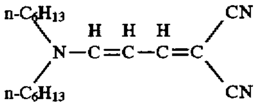

UV-Absorbing Dye UV-2

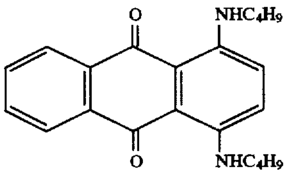

Cyan Dye C-1

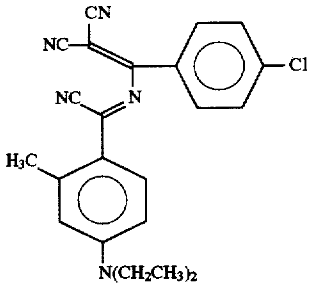

Cyan Dye C-2

Experimental Laser Dye Removal Elements

A 100 μm thick poly(ethylene terephthalate) support was coated with 0.65 g/m$^2$ of the copolymer of 30% ethyl cyanoacrylate and 70% methyl cyanoacrylate, 0.05 g/m$^2$ infrared dye IR-1, and 0.005 g/m$^2$ FC-431 surfactant (3M Corp.) from a 78/20/2 (wt/wt/wt) blend of dichloromethane/acetone/1-methyl-2-pyrollidinone. Particles as shown in Table I were incorporated into this layer to create laser dye removal elements of the invention. A second or imaging layer consisting of 0.22 g/m$^2$ IR-1, 0.60 g/m$^2$ nitrocellulose, 0.28 g/m$^2$ Y-1, 0.14 g/m$^2$ of UV-1, and 0.38 g/m$^2$ of C-1 was coated from an 80/20 (wt/wt) mixture of 4-methyl-2-pentanone and denatured ethanol.

Control Laser Dye Removal Elements

A 100 μm thick poly(ethylene terephthalate) support was coated with 0.38 g/m$^2$ of the copolymer of 30% ethyl cyanoacrylate and 70% methyl cyanoacrylate, 0.05 g/m$^2$ IR-1, and 0.005 g/m$^2$ FC-431® surfactant (3M Corp.) from a 78/20/2 (wt/wt/wt) blend of dichloromethane/acetone/1-methyl-2-pyrollidinone. A second or imaging layer consisting of 0.22 $g/m^2$ IR-1, 0.60 $g/m^2$ nitrocellulose, 0.28 $g/m^2$ of Y-1, 0.13 $g/m^2$ of UV-2, and 0.16 $g/m^2$ of C-2 coated from an 80/20 (wt/wt) mixture of 4-methyl-2-pentanone and denatured ethanol.

This imaging dye layer was then overcoated with 0.22 $g/m^2$ Witcobond® 160 polyurethane (Witco Corporation), 0.008 $g/m^2$ Zonyl FSN® surfactant (DuPont), 0.02 $g/m^2$ Acrysol® RM2020 thickener (Rohm and Haas), 0.05 $g/m^2$ infrared dye IR-2 (omitted in Trial 7 only), and the particles as shown in Table I from a water/methanol solvent blend.

The resistance of the particles to removal was determined in the following manner:

A piece of film was placed face down against a polished metal plate with a center hole connected to a vacuum pump and a hole near the edge connected to a manometer. The film was large enough to completely cover the center hole but smaller than the plate surface and did not cover the hole at the edge. In turn, the film and plate (including the hole at the edge) were covered with a flexible, air tight membrane.

When vacuum is applied, if the gap between the film and the plate is sufficient for air to pass then a vacuum will occur between the membrane and the plate and be registered on the manometer. However, if there is intimate contact between the film and the plate no vacuum will register on the manometer since there is no path for evacuation of that area.

In practice, one measures the time required for the manometer to fall a convenient distance reflecting the ease of drawing a vacuum in the area outside of the film. These measurements are done with film as coated and then with the same piece of film after a brisk wipe with a lint-free tissue. The results of those measurements are shown in Table I.

TABLE I

| Trial | | Particle (Laydown in $g/m^2$) | Placement in Film | Vacuum Drawdown time (sec) As Coated Film | Vacuum Drawdown time (sec) Film After Wiping |
|---|---|---|---|---|---|
| 1 | Invention | P1 (0.02) | Barrier Layer | 12 | 16 |
| 2 | Invention | P2 (0.05) | Barrier Layer | 18 | 22 |
| 3 | Invention | P3 (0.05) | Barrier Layer | 13 | 39 |
| 4 | Invention | P4 (0.01) | Barrier Layer | 25 | 27 |
| 5 | Invention | P1 (0.01) | Barrier Layer | 18 | 30 |
| 6 | Invention | P5 (0.01) | Barrier Layer | 24 | 12 |
| 7 | Control | P6 (0.05) | Overcoat | 84 | >180 |
| 8 | Control | P7 (0.05) | Overcoat | 16 | >180 |
| 9 | Control | P8 (0.05) | Overcoat | 75 | >180 |
| 10 | Control | P9 (0.05) | Overcoat | 3 | >180 |
| 11 | Control | P10 (0.05) | Overcoat | 8 | >180 |

The long drawdown time of the control elements shown above after wiping indicate easy removal of the spacer particles in this system. The elements of invention resist removal of the spacer particles as shown by similar down times before and after wiping.

In a preferred embodiment of the invention, the particles in the barrier layer are sufficiently large as to roughen the surface of the media while being small enough and/or low enough in laydown to avoid allowing light to pass in any appreciable amount This can be defined by the change in measured Status A density (for example blue density) for a film with particles in the barrier layer relative to a control film with no particles in the barrier layer.

The data in Table II were generated from films prepared as described above for the elements of the invention containing particles as shown (Table II). The density can be related to the aggregate particle area for purposes of defining the preferred embodiment. That relationship can be derived from data and is shown in Equation 1 where the "aggregate area" is the particle coverage in $g/m^2$ times the cross-sectional area of the particle (assumed to be a sphere at the average diameter).

Equation 1

Change in Status A Blue Density=−1.0175*Aggregate Area+0.0137

TABLE II

| Particle | Laydown ($g/m^2$) | Diameter (μm) | Aggregate Area ($\mu m^2$*g)/$m^2$ | Status A Blue with Particles minus without Particles |
|---|---|---|---|---|
| None | 0.000 | 0.00 | 0.000 | 0 |
| None | 0.000 | 0.00 | 0.000 | 0 |
| P4 | 0.004 | 3.90 | 0.042 | −0.012 |
| P5 | 0.004 | 4.20 | 0.049 | −0.036 |
| P13 | 0.022 | 2.00 | 0.068 | 0.009 |
| P1 | 0.004 | 5.00 | 0.070 | −0.024 |
| P4 | 0.007 | 3.90 | 0.085 | −0.046 |
| P5 | 0.007 | 4.20 | 0.098 | −0.124 |
| P4 | 0.011 | 3.90 | 0.127 | −0.034 |
| P1 | 0.007 | 5.00 | 0.139 | −0.184 |
| P5 | 0.011 | 4.20 | 0.148 | −0.268 |
| P1 | 0.011 | 5.00 | 0.209 | −0.21 |
| P5 | 0.022 | 4.00 | 0.270 | −0.257 |
| P11 | 0.022 | 4.50 | 0.342 | −0.298 |
| P12 | 0.054 | 3.00 | 0.380 | −0.375 |

A preferred lower limit for particle size in the elements of the invention is 2 μm mean diameter. Using Equation 1 and assuming that losses in blue density less than 0.1 are preferred, one can calculate the maximum amount of particles of various sizes to achieve that result. Since very small quantities (<0.0014 $g/m^2$) of larger beads have limited numbers of neighbors, the data suggest an upper limit in the preferred embodiment of 4.5 μm mean diameter (Table III).

TABLE III

| Particle Mean diameter (μm) | Predicted Maximum Laydown Allowed Without Loss of 0.1 Blue Density ($g/m^2$) |
|---|---|
| 2 | 0.007317 |
| 2.5 | 0.004734 |
| 3 | 0.003228 |
| 3.5 | 0.002367 |
| 4 | 0.001829 |
| 4.5 | 0.001399 |
| 5 | 0.001184 |
| 5.5 | 0.000968 |
| 6 | 0.000753 |

The calculations shown in Table II and Table III illustrate that diameter of from about 2 μm to about 4 μm are preferred in the invention.

The invention has been described in detail with particular reference to preferred embodiments thereof, but it will be understood that variations and modifications can be effected within the spirit and scope of the invention.

What is claimed is:

1. An ablative recording element comprising a support having thereon, in order, a barrier layer and a colorant layer comprising a colorant dispersed in a polymeric binder, said colorant layer having an infrared-absorbing material associated therewith, and wherein said barrier layer contains from about 0.05 $g/m^2$ to about 1.0 $g/m^2$ of polymeric beads having a mean diameter of from about 2 μm to about 4 μm dispersed in a vinyl polymer having recurring units of the following formula:

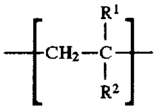

wherein:

$R^1$ and $R^2$ each independently represents a halogen atom; a haloalkyl group with at least one halogen atom in its beta-position of the carbon to which $R^1$ or $R^2$ is attached; a ketal group; an acetal group; a thioketal group; a thioacetal group; a substituted or unsubstituted alkyl group; or a group containing a double or triple bond between any two atoms, one of which is adjacent to the carbon to which $R^1$ or $R^2$ is attached;

with the proviso that at least one of $R^1$ and $R^2$ represents a group containing a double or triple bond between any two atoms, one of which is adjacent to the carbon to which $R^1$ or $R^2$ is attached; or $R^1$ and $R^2$ may be joined together to form a ring.

2. The element of claim 1 wherein said $R^1$ and $R^2$ each independently represents—C═$XR^3$, where X is O, S, NR, or $N(R)_2^+$; $R^3$ is R, OR, $O^-M^+$, OCOOR, SR, NHCOR, $NHCON(R)_2$, $N(R)_2$, $N(R)_3^+$, or $(N)_3$; $M^+$ is an alkali or ammonium moiety; and R is hydrogen, halogen, or a substituted or unsubstituted alkyl or cycloalkyl group; or X and $R^3$ may be joined together to form a ring.

3. The element of claim 1 wherein said vinyl polymer is a poly(alkyl cyanoacrylate).

4. The element of claim 3 wherein said poly(alkyl cyanoacrylate) is poly(methyl 2-cyanoacrylate or poly(ethyl 2-cyanoacrylate).

5. The element of claim 1 wherein said barrier layer is present at a concentration of from about 0.05 to about 1.0 $g/m^2$.

6. The element of claim 1 wherein said barrier layer also contains an infrared-absorbing dye.

7. The element of claim 1 wherein said infrared-absorbing material is a dye which is contained in said colorant layer.

8. The element of claim 1 wherein said support is transparent.

9. The element of claim 1 wherein said colorant is a dye.

10. The element of claim 1 wherein said infrared-absorbing material is a pigment which is contained in said colorant layer.

11. A process of forming a single color, ablation image comprising imagewise heating by means of a laser, an ablative recording element comprising a support having thereon, in order, a barrier layer and a colorant layer comprising a colorant dispersed in a polymeric binder, said colorant layer having an infrared-absorbing material associated therewith, said laser exposure taking place through the colorant side of said element, and removing the ablated colorant to obtain said image in said ablative recording element, wherein said barrier layer contains from about 0.05 $g/m^2$ to about 1.0 $g/m^2$ of polymeric beads having a mean diameter of from about 2 μm to about 4 μm dispersed in a vinyl polymer having recurring units of the following formula:

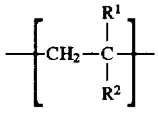

wherein:

$R^1$ and $R^2$ each independently represents a halogen atom; a haloalkyl group with at least one halogen atom in its beta-position of the carbon to which $R^1$ or $R^2$ is attached; a ketal group; an acetal group; a thioketal group; a thioacetal group; a substituted or unsubstituted alkyl group; or a group containing a double or triple bond between any two atoms, one of which is adjacent to the carbon to which $R^1$ or $R^2$ is attached;

with the proviso that at least one of $R^1$ and $R^2$ represents a group containing a double or triple bond between any two atoms, one of which is adjacent to the carbon to which $R^1$ or $R^2$ is attached; or $R^1$ and $R^2$ may be joined together to form a ring.

12. The process of claim 11 wherein said $R^1$ and $R^2$ each independently represents—C═$XR^3$, where X is O, S, NR, or $N(R)_2^+$; $R^3$ is R, OR, $O^-M^+$, OCOOR, SR, NHCOR, $NHCON(R)_2$, $N(R)_2$, $N(R)_3^+$, or $(N)_3$; $M^+$ is an alkali or ammonium moiety; and R is hydrogen, halogen, or a substituted or unsubstituted alkyl or cycloalkyl group; or X and $R^3$ may be joined together to form a ring.

13. The process of claim 11 wherein said barrier layer is present at a concentration of from about 0.05 to about 1.0 $g/m^2$.

14. The process of claim 11 wherein said barrier layer also contains an infrared-absorbing dye.

15. The process of claim 11 wherein said infrared-absorbing material is a dye which is contained in said colorant layer.

16. The process of claim 11 wherein said infrared-absorbing material is a pigment which is contained in said colorant layer.

* * * * *